United States Patent [19]

Hozumi

[11] Patent Number: 5,256,589
[45] Date of Patent: Oct. 26, 1993

[54] METHOD OF IMPROVING THE FLATNESS OF WIRING LAYER

[75] Inventor: Hiroki Hozumi, Kagoshima, Japan

[73] Assignee: Sony Corporation, Tokyo, Japan

[21] Appl. No.: 880,555

[22] Filed: May 8, 1992

[30] Foreign Application Priority Data

May 10, 1991 [JP] Japan .................. 3-105604

[51] Int. Cl.$^5$ .................................. H01L 21/70
[52] U.S. Cl. ........................... 437/60; 437/32; 437/33; 437/69
[58] Field of Search ............... 437/32, 33, 69, 60

[56] References Cited

U.S. PATENT DOCUMENTS 4,721,687  1/1988  Kakumu et al. ............... 437/69
4,879,252  11/1989  Komatsu ....................... 437/32

FOREIGN PATENT DOCUMENTS 0014165  2/1979  Japan .......................... 437/69
4043663  2/1992  Japan .......................... 437/69

Primary Examiner—Olik Chaudhuri
Assistant Examiner—Long Pham
Attorney, Agent, or Firm—Hill, Steadman & Simpson

[57] ABSTRACT

A semiconductor device fabricating method removes bird's head formed in the edges of a SiO$_2$ film formed by a recessed LOCOS process in fabricating a semiconductor device. The semiconductor device fabricating method comprises steps of forming device isolating regions (6) on a silicon substrate (1) by a recessed LOCOS process, forming an insulating film (10) over the entire surface of the work, and simultaneously forming contacts of a polycrystalline silicon film (15) between the device isolating regions (6) and resistors of the polycrystalline silicon film (15) over the device isolating regions (6). Portions of the polycrystalline silicon film (15) corresponding to the bird's heads in the edges of the insulating film (10) are removed selectively, and exposed portions of the insulating film (10) and the bird's heads in the device isolating regions (6) are removed sequentially by etching to flatten the surface of the work.

1 Claim, 4 Drawing Sheets

FIG. IA
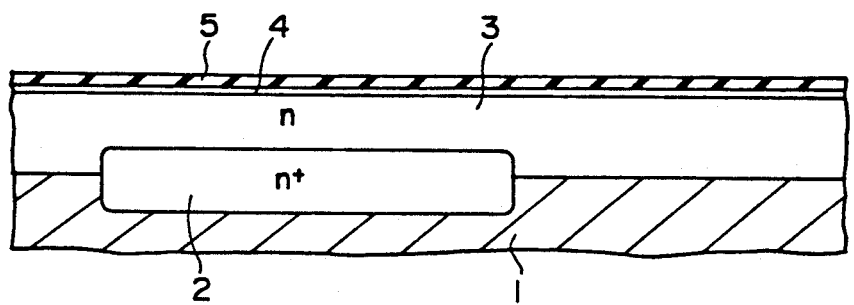
FIG. IB
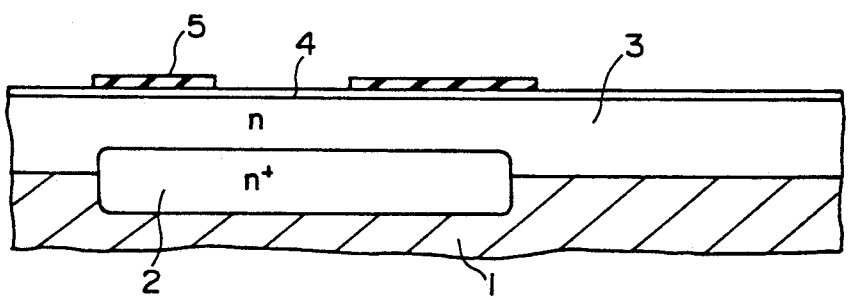
FIG. IC
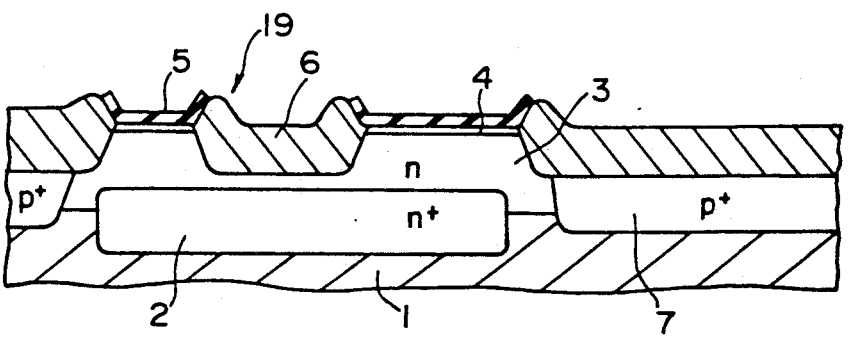

METHOD OF IMPROVING THE FLATNESS OF WIRING LAYER

BACKGROUND OF THE INVENTION

1. Field of the Invention

The present invention relates to a semiconductor device fabricating method and, more particularly, to a semiconductor device fabricating method capable of securing the flatness and reliability of a wiring layer formed over an oxide film by reducing the step of bird's heads in the underlying oxide film formed by a LOCOS process.

2. Description of the Prior Art

A LOCOS process, which oxidizes portions of a silicon substrate selectively to form thick oxide films locally, is an important process of isolating the devices of an LSI circuit and is effective for securing parasitic capacity, wiring capacity and field Vth. When a portion of a silicon (Si) substrate is oxidized into $SiO_2$, the volume of the oxidized portion of the Si substrate increases. Accordingly, the $SiO_2$ portion protrudes from the surface of the Si substrate to deteriorate the flatness of the surface of the Si substrate. A known recessed LOCOS process etches a Si substrate to form recesses corresponding to portions which are to be oxidized and oxidizes the recessed portions in order that the surface of the Si substrate is flat after the Si substrate has been subjected to the recessed LOCOS process. In the recessed LOCOS process, a $SiO_2$ film 21 is formed by hot oxidation over the surface of a Si substrate 20, a $Si_3N_4$ film 22 is formed over the $SiO_2$ film 21 by a CVD process as shown in FIG. 4(a), portions of the $Si_3N_4$ film 22, the $SiO_2$ film 21 and the Si substrate 20 are removed selectively by mesa etching as shown in FIG. 4(b), and then, a LOCOS $SiO_2$ film 23 is formed by high-temperature humid oxidation, and then the $Si_3N_4$ film 22 and the $SiO_2$ film 21 are removed to expose the device forming area of the Si substrate 20 as shown in FIG. 4(c).

Although the recessed LOCOS process finishes the surface of the Si substrate in a generally flat surface, bird's heads 24, i.e., protrusions, having a height W1 are formed along the edges of the LOCOS $SiO_2$ film 23. These bird's heads 24 is liable to form breaks in a wiring pattern formed over the LOCOS $SiO_2$ film 23, deteriorating the reliability of the associated device.

SUMMARY OF THE INVENTION

Accordingly, it is an object of the present invention to provide a semiconductor device fabricating method capable of flattening bird's heads formed in a LOCOS $SiO_2$ film formed by a recessed LOCOS process.

A semiconductor device fabricating method in one aspect of the present invention comprises steps of: forming a $SiO_2$ film in a pattern corresponding to a device isolating regions on the surface of a Si substrate by a recessed LOCOS process; forming an insulating layer over the entire surface of the work, and simultaneously forming contacts of a polycrystalline silicon film between the device isolating regions, and resistors of the polycrystalline silicon film over the device isolating regions; wherein portions of the polycrystalline silicon film extending over the protruding portions of the $SiO_2$ film coating the device isolating regions are removed selectively, and the exposed portions of the insulating layer and the protruding portions of the $SiO_2$ film coating the device isolating regions are removed sequentially by etching using the polycrystalline silicon film as a mask to flatten the surface of the work.

Since the bird's heads formed in the edges of the $SiO_2$ film formed by the recessed LOCOS process are flattened by etching, breakage of the wiring layer overlying the $SiO_2$ film and the deterioration of the reliability of the device can be prevented.

BRIEF DESCRIPTION OF THE DRAWINGS

The above and other objects, features and advantages of the present invention will become more apparent from the following description taken in connection with the accompanying drawings, in which:

FIGS. 1(a), 1(b) and 1(c) are schematic sectional views of a work in the initial stage of a semiconductor device fabricating method in a preferred embodiment according to the present invention;

DESCRIPTION OF THE PREFERRED EMBODIMENT

Figure 2A:
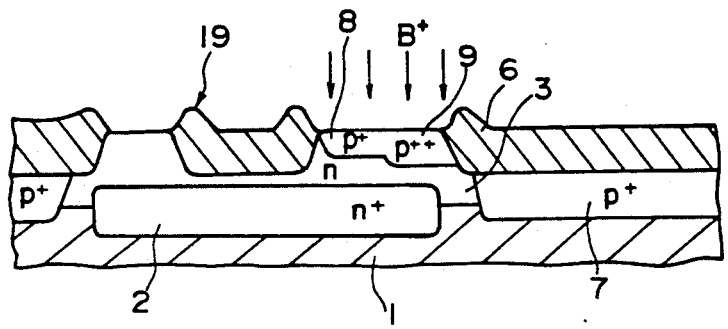
FIGS. 2(a), 2(b) and 2(c) are schematic sectional views of the work in the middle stage of the semiconductor device fabricating method.

Referring to FIG. 1(a), the surface of a p-type Si substrate 1 is subjected to thermal oxidation to form a $SiO_2$ film, not shown, an opening is formed in the $SiO_2$ film, and an exposed portion of the p-type Si substrate 1 is doped with antimony (Sb) or arsenic (As) to form a heavily doped n+-type buried layer 2. Then, after removing the $SiO_2$ film, an n-type epitaxial layer 3 is formed by an epitaxial growth process, a $SiO_2$ film 4 of 300 Å in thickness is formed by thermal oxidation, and then, a silicon nitride ($Si_3N_4$) film 5 of 700 Å in thickness is formed by a CVD process.

Then, as shown in FIGS. 1(b) and 1(c), the $Si_3N_4$ film 5 is etched in a pattern to form an oxidation-resistant mask, the work is subjected to a boron-ion implantation process to form a p+-type layer 7 and to a recessed LOCOS process, in which the patterned $Si_3N_4$ film 5 is used as an oxidation-resistant mask, to form a LOCOS $SiO_2$ film 6 in device isolating regions. In the recessed LOCOS process, bird's heads 19 are formed in the edges of the LOCOS $SiO_2$ film 6.

Then, as shown in FIG. 2(a), after removing the $Si_3N_4$ film 5 and the $SiO_2$ film 4 by etching, portions of the n-type epitaxial layer 3 is doped with B+ by ion implantation to form a p+-type diffused base layer 8 and a p++-type diffused base layer 9.

Figure 2B:
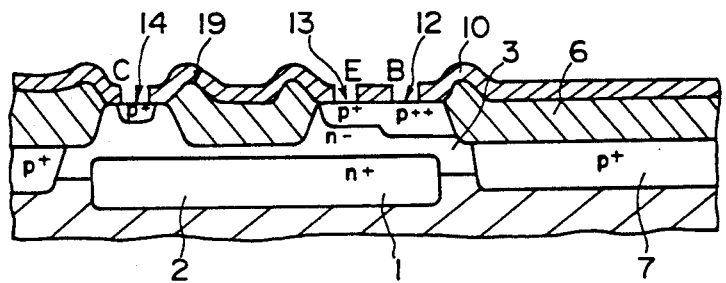

As shown in FIG. 2(b), a first insulating film 10 of $SiO_2$ of 3000 Å in thickness is formed over the entire surface of the work. After base diffusion, emitter diffusion and collector diffusion, openings 12, 13 and 14 for a base B, an emitter E and a collector C are formed in the first insulating film 10.

Figure 2C:
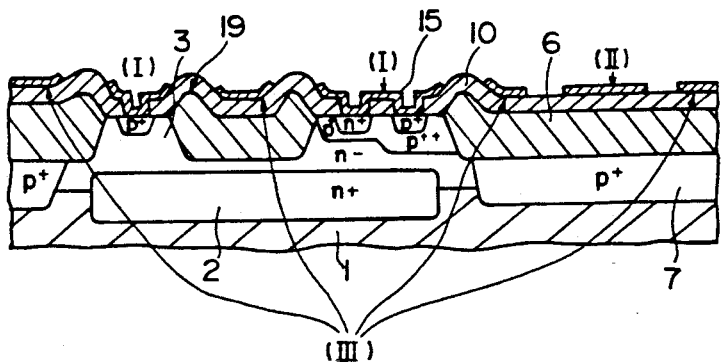

Then, as shown in FIG. 2(c), a polycrystalline silicon film 15 of a thickness in the range of 1000 to 3000 Å is formed over the surface of the work by a CVD process, and then the polycrystalline silicon film 15 is etched in a pattern. In FIG. 2(c), indicated at (I) is a transistor forming region covered entirely by the polycrystalline silicon film in which the emitter of a polycrystalline silicon washed transistor and a contact is to be formed, at (II) is a polycrystalline silicon resistor region to serve as a polycrystalline silicon resistor formed over the SiO$_2$ film in a pattern having a desired resistance, and at (III) are dummy pattern regions separated from the transistor forming region (I) and the polycrystalline silicon resistor region (II) and surrounding the bird's heads 19.

Figure 3A:
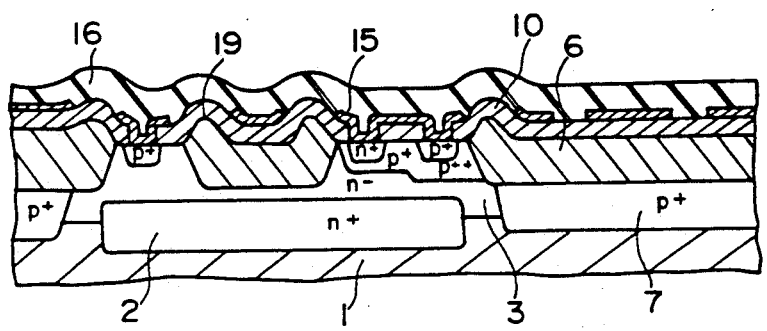
FIGS. 3(a) and 3(b) are schematic sectional views of the work in the final stage of the semiconductor device fabricating method.

Then, as shown in FIG. 3(a), a second insulating film 16 (SiO$_2$ film) of about 3000 Å in thickness is formed over the entire surface of the work by a CVD process, and the work is subjected to emitter diffusion for emitter activation and the like.

Figure 3B:
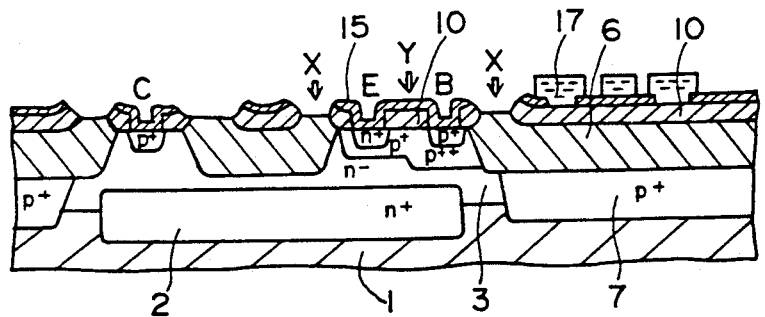
Figure 4A:
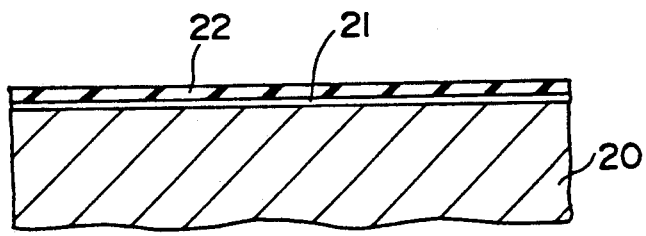
FIGS. 4(a), 4(b) and 4(c) are schematic sectional views of assistance in explaining a conventional semiconductor device fabricating method.
Figure 4B:
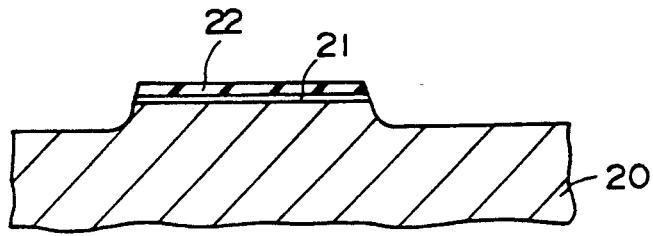
Figure 4C:
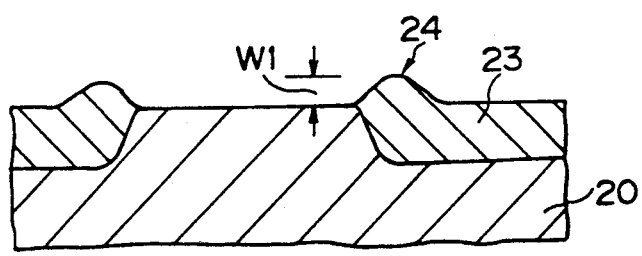

Finally, as shown in FIG. 3(b), the second insulating film 16 is removed by etching. In etching the second insulating film 16, portions indicated at X of the bird's heads 19 are removed by over-etching by using the polycrystalline silicon film 15 as a mask to improve the flatness of the surface of the work. Only portions of the bird's heads 19 corresponding to portions of the polycrystalline silicon film 15 removed by reactive ion etching are over-etched to flatten the surface of the work.

Since a portion indicated at Y of the first insulating film 10 (SiO$_2$ film) corresponding to the activated region for the transistor is protected by the polycrystalline silicon film 15 in removing the bird's heads 19 by over-etching, a sufficient insulation and a field Vth can be secured. In FIG. 3(b), a resist film 17 protects flat portions of the first insulating film 10 from over-etching. Thus, a transistor having a base B, an emitter E and a collector C and not having any bird's head is completed.

As is apparent from the foregoing description, since the semiconductor device thus fabricated has a flat surface, the migration of a wiring layer overlying the first insulating film is suppressed to enhance the reliability of the wiring layer and the coverage of the interlayer insulating film is improved. Furthermore, the semiconductor device fabricating method of the present invention has steps not more than those of the conventional semiconductor device fabricating method and is capable of fabricating a semiconductor device without entailing increase in the cost.

Although the invention has been described in its preferred form with a certain degree of particularity, obviously many changes and variations are possible therein. It is therefore to be understood that the present invention may be practiced otherwise than a specifically described herein without departing from the spirit and scope thereof.

What is claimed is:

1. A semiconductor device fabricating method comprising steps of: forming device isolating regions on a silicon substrate by a recessed LOCOS process; forming an insulating layer over the entire surface; and simultaneously forming contacts of a polycrystalline silicon film between the device isolating regions and forming resistors of the polycrystalline silicon film over the device isolating regions;

wherein the portions of the polycrystalline silicon film corresponding protrusions formed in the edges of the device isolating regions are removed selectively, exposed portions of the insulating layer and the protrusions formed in the edges of the device isolating regions are removed sequentially by etching, using the polycrystalline silicon film as a mask.

* * * * *